(12) United States Patent
Sugiyama et al.

(10) Patent No.: US 7,719,650 B2
(45) Date of Patent: May 18, 2010

(54) DISPLAY PANEL AND DISPLAY DEVICE

(75) Inventors: Saori Sugiyama, Mobara (JP); Yasuko Gotoh, Mobara (JP)

(73) Assignee: Hitachi Displays, Ltd., Mobara-shi (JP)

( * ) Notice: Subject to any disclaimer, the term of this patent is extended or adjusted under 35 U.S.C. 154(b) by 282 days.

(21) Appl. No.: 11/481,974

(22) Filed: Jul. 7, 2006

(65) Prior Publication Data

US 2007/0007526 A1    Jan. 11, 2007

(30) Foreign Application Priority Data

Jul. 8, 2005    (JP)    ............... 2005-200314

(51) Int. Cl.
  *G02F 1/1343*    (2006.01)
(52) U.S. Cl. ........................ 349/139; 29/827
(58) Field of Classification Search ............ 349/58, 349/141, 144, 152, 139; 29/827
  See application file for complete search history.

(56) References Cited

U.S. PATENT DOCUMENTS

| | | | | |
|---|---|---|---|---|
| 2,930,107 A | * | 3/1960 | Martin | 438/113 |
| 3,144,709 A | * | 8/1964 | Hansson et al. | 29/413 |
| 3,304,594 A | * | 2/1967 | Madland | 438/11 |
| 3,493,671 A | * | 2/1970 | Forsaith et al. | 174/254 |
| 3,544,857 A | * | 12/1970 | King et al. | 257/668 |
| 3,608,186 A | * | 9/1971 | Hutson | 438/114 |
| 3,768,986 A | * | 10/1973 | Ramos et al. | 428/577 |
| 3,978,516 A | * | 8/1976 | Noe | 257/668 |
| 4,044,460 A | * | 8/1977 | Schachter | 29/842 |
| 4,044,888 A | * | 8/1977 | Schachter | 206/717 |
| 4,094,058 A | * | 6/1978 | Yasutake et al. | 29/592.1 |
| 4,216,523 A | * | 8/1980 | Harford | 361/729 |
| 4,217,689 A | * | 8/1980 | Fujii et al. | 438/465 |
| 4,255,848 A | * | 3/1981 | Freer et al. | 29/592.1 |
| 4,275,494 A | * | 6/1981 | Kohyama et al. | 29/592.1 |
| 4,366,198 A | * | 12/1982 | Ramspacher, Jr. | 428/43 |
| 4,425,380 A | * | 1/1984 | Nuzzi et al. | 427/97.2 |
| 4,426,773 A | * | 1/1984 | Hargis | 29/832 |
| 4,455,185 A | * | 6/1984 | Sasaki et al. | 156/250 |
| 4,597,636 A | * | 7/1986 | Hoshikawa | 349/158 |
| 4,631,805 A | * | 12/1986 | Olsen et al. | 438/123 |
| 4,756,080 A | * | 7/1988 | Thorp et al. | 29/827 |
| 4,796,080 A | * | 1/1989 | Phy | 257/671 |
| 4,809,053 A | * | 2/1989 | Kuraishi | 257/675 |
| 4,829,404 A | * | 5/1989 | Jensen | 361/749 |
| 4,830,554 A | * | 5/1989 | Lopez | 409/164 |
| 4,852,227 A | * | 8/1989 | Burks | 29/25.42 |
| 5,017,164 A | * | 5/1991 | Gibbs | 439/885 |

(Continued)

FOREIGN PATENT DOCUMENTS

JP    57169293 A    * 10/1982

(Continued)

*Primary Examiner*—Frank G Font
*Assistant Examiner*—Peter Radkowski
(74) *Attorney, Agent, or Firm*—Antonelli, Terry, Stout & Kraus, LLP.

(57) ABSTRACT

The proceeding of peeling of a conductive layer in the vicinity of terminals is prevented. A display panel includes a conductive layer extending to the outside of terminals, and the conductive layer has slits extending in directions from one end face to the other end face alternately at two end faces along the extending direction of the conductive layer.

28 Claims, 5 Drawing Sheets

U.S. PATENT DOCUMENTS

| | | | | |
|---|---|---|---|---|
| 5,047,279 | A * | 9/1991 | Nasu et al. | 428/156 |
| 5,150,237 | A * | 9/1992 | Iimura et al. | 349/118 |
| 5,175,638 | A * | 12/1992 | Kanemoto et al. | 349/121 |
| 5,217,916 | A * | 6/1993 | Anderson et al. | 438/128 |
| 5,233,448 | A * | 8/1993 | Wu | 349/40 |
| 5,288,539 | A * | 2/1994 | Araki | 428/136 |
| 5,304,843 | A * | 4/1994 | Takubo et al. | 257/670 |
| 5,430,933 | A * | 7/1995 | Marx et al. | 29/846 |
| 5,508,089 | A * | 4/1996 | Schulz-Harder | 428/209 |
| 5,531,860 | A * | 7/1996 | Li | 29/827 |
| 5,536,906 | A * | 7/1996 | Haas et al. | 174/529 |
| 5,565,008 | A * | 10/1996 | Shigetomo et al. | 29/25.01 |
| 5,592,199 | A * | 1/1997 | Kawaguchi et al. | 345/206 |
| 5,610,080 | A * | 3/1997 | Murakami | 29/593 |
| 5,621,193 | A * | 4/1997 | Isaak | 174/262 |
| 5,659,477 | A * | 8/1997 | Collins | 700/95 |
| 5,770,290 | A * | 6/1998 | McHenry et al. | 428/43 |
| 5,773,764 | A * | 6/1998 | von Vajna | 174/250 |
| 5,783,289 | A * | 7/1998 | Suzuki et al. | 428/195.1 |
| 5,789,302 | A * | 8/1998 | Mitwalsky et al. | 438/462 |
| 5,831,218 | A * | 11/1998 | Hu et al. | 174/250 |
| 5,869,353 | A * | 2/1999 | Levy et al. | 438/109 |
| 5,995,178 | A * | 11/1999 | Fujikawa et al. | 349/55 |
| 6,025,641 | A * | 2/2000 | Park | 257/668 |
| 6,093,578 | A * | 7/2000 | Klappert et al. | 438/30 |
| 6,103,554 | A * | 8/2000 | Son et al. | 438/126 |
| 6,104,465 | A | 8/2000 | Na et al. | |
| 6,113,999 | A * | 9/2000 | Takigami | 428/43 |
| 6,204,906 | B1 * | 3/2001 | Tannas, Jr. | 349/153 |
| 6,271,578 | B1 * | 8/2001 | Mitwalsky et al. | 257/620 |
| 6,509,949 | B1 * | 1/2003 | Lu et al. | 349/187 |
| 6,525,718 | B1 * | 2/2003 | Murakami et al. | 345/206 |
| 6,528,236 | B1 * | 3/2003 | Fukase et al. | 430/280.1 |
| 6,554,412 | B1 * | 4/2003 | Seino et al. | 347/86 |
| 6,577,367 | B2 * | 6/2003 | Kim | 349/139 |
| 6,636,281 | B1 * | 10/2003 | Kanatsu | 349/58 |
| 6,638,592 | B1 * | 10/2003 | Schulz-Harder | 428/43 |
| 6,751,861 | B2 * | 6/2004 | Ohira et al. | 29/846 |
| 6,760,227 | B2 * | 7/2004 | Sakai et al. | 361/736 |
| 6,794,584 | B2 * | 9/2004 | Tanaka | 174/261 |
| 6,812,494 | B2 * | 11/2004 | Mochizuki et al. | 257/75 |
| 6,819,371 | B2 * | 11/2004 | Kanatsu | 349/58 |
| 6,828,170 | B2 * | 12/2004 | Roberts et al. | 438/27 |
| 6,844,504 | B2 * | 1/2005 | Wang et al. | 174/255 |
| 6,872,436 | B2 * | 3/2005 | Suzuki et al. | 428/43 |
| 6,976,415 | B2 * | 12/2005 | Suzuki et al. | 83/51 |
| 6,995,032 | B2 * | 2/2006 | Bruhns et al. | 438/33 |
| 7,060,911 | B2 * | 6/2006 | Tanaka | 174/261 |
| 7,065,869 | B2 * | 6/2006 | Kang et al. | 29/847 |
| 7,161,651 | B2 * | 1/2007 | Smovzh | 349/187 |
| 7,323,641 | B2 * | 1/2008 | Higuchi et al. | 174/250 |
| 2001/0002509 | A1 * | 6/2001 | Suhara | 29/834 |
| 2001/0033127 | A1 * | 10/2001 | Mizutani et al. | 313/292 |
| 2001/0054616 | A1 * | 12/2001 | Ramsey et al. | 220/258 |
| 2002/0020555 | A1 * | 2/2002 | Daido | 174/261 |
| 2002/0031860 | A1 * | 3/2002 | Tanimura | 438/108 |
| 2002/0127775 | A1 * | 9/2002 | Haba et al. | 438/109 |
| 2002/0127824 | A1 * | 9/2002 | Shelton et al. | 438/463 |
| 2002/0173178 | A1 * | 11/2002 | Matsunaga | 439/67 |
| 2003/0034169 | A1 * | 2/2003 | Tanaka | 174/59 |
| 2003/0038359 | A1 * | 2/2003 | Fujimoto et al. | 257/688 |
| 2003/0143899 | A1 * | 7/2003 | Fulk et al. | 439/885 |
| 2003/0150110 | A1 * | 8/2003 | Kang et al. | 29/846 |
| 2003/0160317 | A1 * | 8/2003 | Sakamoto et al. | 257/690 |
| 2003/0192583 | A1 * | 10/2003 | Ryan | 136/244 |
| 2003/0192585 | A1 * | 10/2003 | Beckenbaugh et al. | 136/263 |
| 2003/0201709 | A1 * | 10/2003 | Mizutani et al. | 313/495 |
| 2004/0012746 | A1 * | 1/2004 | Kanatsu | 349/152 |
| 2004/0017536 | A1 * | 1/2004 | Takenaka | 349/150 |
| 2004/0031520 | A1 * | 2/2004 | Ryan | 136/263 |
| 2004/0119925 | A1 * | 6/2004 | Moon | 349/139 |
| 2004/0232488 | A1 * | 11/2004 | Forbes | 257/347 |
| 2005/0227534 | A1 * | 10/2005 | Nakano | 439/566 |
| 2006/0290835 | A1 * | 12/2006 | Sakuma | 349/58 |

FOREIGN PATENT DOCUMENTS

| | | | |
|---|---|---|---|
| JP | 03165094 A | * | 7/1991 |
| JP | 03228388 A | * | 10/1991 |
| JP | 04264790 A | * | 9/1992 |
| JP | 07202624 A | * | 8/1995 |
| JP | 08039977 A | * | 2/1996 |
| JP | 11126964 A | * | 5/1999 |
| JP | 2000173551 A | * | 6/2000 |
| JP | 2001148613 A | * | 5/2001 |
| JP | 2001236890 A | * | 8/2001 |
| JP | 2002062821 A | * | 2/2002 |
| JP | 2002134860 A | * | 5/2002 |
| JP | 2005-49738 | | 2/2005 |
| JP | 2007017767 A | * | 1/2007 |
| KR | 10-0237679 | | 7/1997 |

* cited by examiner

DISPLAY PANEL AND DISPLAY DEVICE

The present application claims priority from Japanese application JP2005-200314 filed on Jul. 8, 2005, the content of which is hereby incorporated by reference into this application.

BACKGROUND OF THE INVENTION

1. Field of the Invention

The invention relates to a display panel and a display device.

2. Background Art

Conventionally, there is a liquid crystal display device as a display device for displaying images or video.

The liquid crystal display device is a display device including a liquid crystal display panel in which a liquid crystal material is filled between two substrates, which is widely used, for example, for a display of a cellular phone terminal, a television set or a display of a PC (Personal Computer) and the like.

The liquid crystal display panel has, for example, TFT elements provided in array at one substrate, and a color filter is provided at the other substrate.

At this time, in the TFT substrate in which the TFT elements are provided in array, a gate wiring, a source wiring, a drain wiring and the like for disposing the TFT elements are formed on a transparent substrate such as a glass substrate. Further at this time, the gate wiring, the source wiring and the like are concentrated and led out at edges of the transparent substrate.

The TFT substrate is usually manufactured using a transparent substrate which is larger than an outside dimension required for the liquid crystal display panel, and is cut out so as to fit into the outside dimension required for the liquid crystal display panel finally. When the TFT substrate is manufactured, electrostatic discharge damage may occur, which damages the formed TFT elements by being charged, for example, during an exposure process. Therefore, in the manufacturing process of the TFT substrate, wirings which are concentrated and led out at edges of the transparent substrate are short-circuited and grounded outside regions at which the substrate is cut out. Then, when being cut out finally, the wirings are cut to make them electrically independent.

Also in the case, in addition to the above wirings, for example, a dummy metal layer for preventing the electrostatic discharge damage may be provided at edges of the transparent substrate (for example, refer to Patent Document 1).

[Patent Document] JP-A-2005-49738

SUMMARY OF THE INVENTION

A conductive layer such as wirings which are concentrated and led out at edges of the TFT substrate is electrically connected to outer leads of a TCP (Tape Carrier Package) or a COF (Chip On Film) on which a driver IC is mounted. The wirings concentrated and led out at edges of the TFT substrate and the outer leads of the TCP or the COF are electrically connected using, for example, an ACF (Anisotropic Conductive Film), and at this time, the faulty connection caused by displacement and the like tends to occur. In the case that the faulty connection such as displacement occurs, it is conceivable that a repair work in which the TCP or the COF is removed once, the surface of the wirings is cleaned, then, the outer leads of the TCP or the COF are connected thereto again.

When removing the ACF, friction and external force are added. If peeling occurs at an end portion of the wiring, the peeling proceeds to a connection area between the wirings and the outer leads of the TCP or the COF, as a result, the faulty connection occurs therebetween.

Especially, in the case that the wiring or the conductive layer reaches at an end face of the TFT substrate in an exposed state, peeling tends to occur.

The above problem occurs also in a substrate of a display panel having a similar structure, not limited to the TFT substrate of the liquid crystal display panel.

An object of the invention is to provide a technique whereby proceeding of peeling in the conductive layer or wirings around terminals can be prevented.

The above object, other objects and novel features of the invention will be clarified by description of the specification and attached drawings.

Structural examples of a display panel and a display device are, for example, as follows.

(1) A display panel includes a conductive layer extending to the outside of terminals, and the conductive layer has slits extending in directions from one end face to the other end face alternately at two end faces along the extending direction of the conductive layer.

(2) In the display panel of the above (1), the slits extending in a direction from a first end face to a second end face of the conductive layer and the slits extending in a direction from the second end face to the first end face are displaced with respect to each other in the extending direction of the conductive layer, and overlapped with each other in the width direction.

(3) In the display panel of the above (2), the slits extend in oblique directions with respect to the extending direction of the conductive layer.

(4) In the display panel of the above (2) or (3), an angle between the extending direction of the conductive layer and the extending direction of the slits is 30 degrees to 150 degrees.

(5) In the display panel of any of the above (2) to (4), the conductive layer is formed by stacking two kinds of conductors and the slits are provided in the two kinds of conductors.

(6) In the display panel of any of the above (2) to (4), the conductive layer is formed by stacking two kinds of conductors and the slits are provided in either one of the two kinds of conductors.

(7) In the display panel of any of the above (1) to (6), the conductive layer reaches an end face of a substrate.

(8) A display device includes any of the display panels (1) to (7).

The display panel in the invention, as in the structural example (1), slits extending in the direction from one end face to the other end face are provided alternately on the conductive layer. Accordingly, for example, when peeling occurs at the end portion of the conductive layer, the conductive layer is folded or cut off at the region where the slits are provided, therefore, the peeling is prevented from proceeding further from the region. When the slits are provided between the end face of the substrate and a connecting terminal portion of the outer lead of the TCP or the COF, the faulty connection to the outer lead caused by peeling at the connecting terminal portion can be prevented.

Since the slits are provided at the conductive layer, the proceeding of peeling or corrosion can be prevented, the conductive layer (wirings) can be short-circuited and grounded outside regions where the substrate is cut out in manufacturing processes as in the conventional display panel, therefore, electrostatic discharge damage of elements by being charged can be prevented.

When providing slits on the conductive layer, by taking a structure as in the structural example (2), the conductive layer is made to be flexible, or to be cut off easily.

In the above case, as in the structural example (3), it is preferable that the slits of the conductive layer are provided in oblique directions with respect to the extending direction of the conductive layer. The direction of the slits may be the wiring width direction which is orthogonal to the extending direction of the conductive layer, and, for example, an angle between the extending direction of the conductive layer and the extending direction of the slits may be set to 30 degrees to 150 degrees as in the structural example (4).

It is not always necessary that the conductive layer is a single conductor but may have a structure in which two kinds of conductors are stacked as in the structural example (5) or in the structural example (6). In this case, a combination of conductors is arbitrary, and may be a combination of a transparent conductor such as an ITO and a metal, for example. It is also preferable that the slits are provided in the two kinds of conductors as in the structural example (5), or provided in either one of conductors as in the structural example (6).

In the case that the conductive layer (wirings) is short-circuited and grounded outside regions where the substrate is cut out in manufacturing processes of the display panel from the structural example (1) to the structural example (6), the conductive layer reaches the end face of the substrate as in the structural example (7). At this time, since the conductive layer is exposed at end faces of the substrate, peeling or corrosion tends to occur especially. Therefore, connection reliability of the connecting terminal portion can be improved by providing the slits for preventing peeling or corrosion.

In a display device including any of the display panels from the structural example (1) to the structural example (7) as in the structural example (8), since the end portion of the wiring is exposed at the substrate end face, the wiring may corrode. However, when the slits are provided as in the structural example (1) to the structural example (7), the corrosion of the wiring can be prevented at the region where the slits are provided. Accordingly, the slits are provided between the end face of the substrate and the connection area for the outer lead of the TCP or the COF, thereby making the conduction failure hardly occur, which is caused by the corrosion of the connection part for the outer lead in the wiring.

DETAILED DESCRIPTION OF THE PREFERRED EMBODIMENT

Hereinafter, according to the invention, an embodiment will be explained in detail with reference to the drawings. In all the drawings for explaining embodiments, components having the same functions are referred to by the same numerals and signs, and the repeated explanations are omitted.

Embodiment

Figure 1:
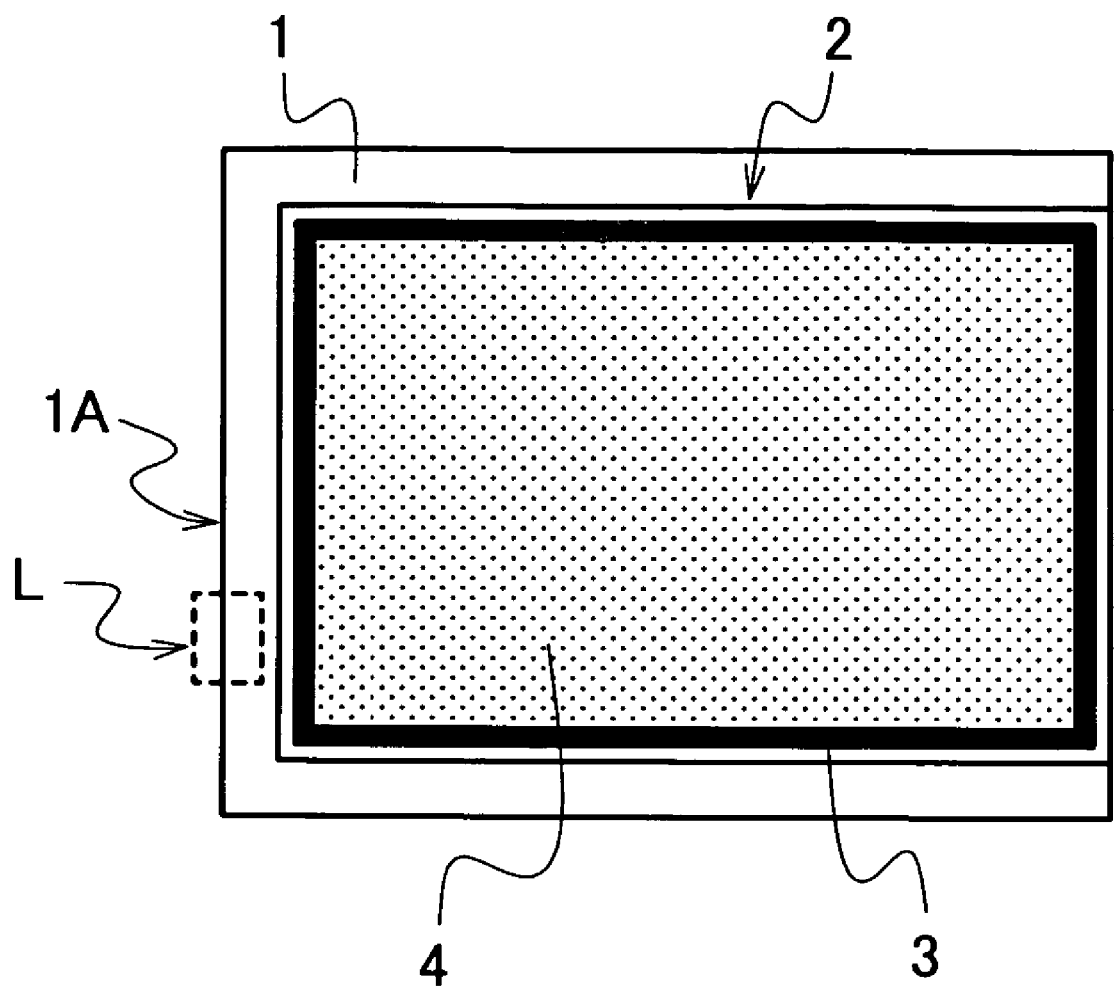
FIG. 1 is a schematic view showing a schematic structure of a display panel according to an embodiment of the invention, which is a plan view showing the whole structure of the display panel.
Figure 2:
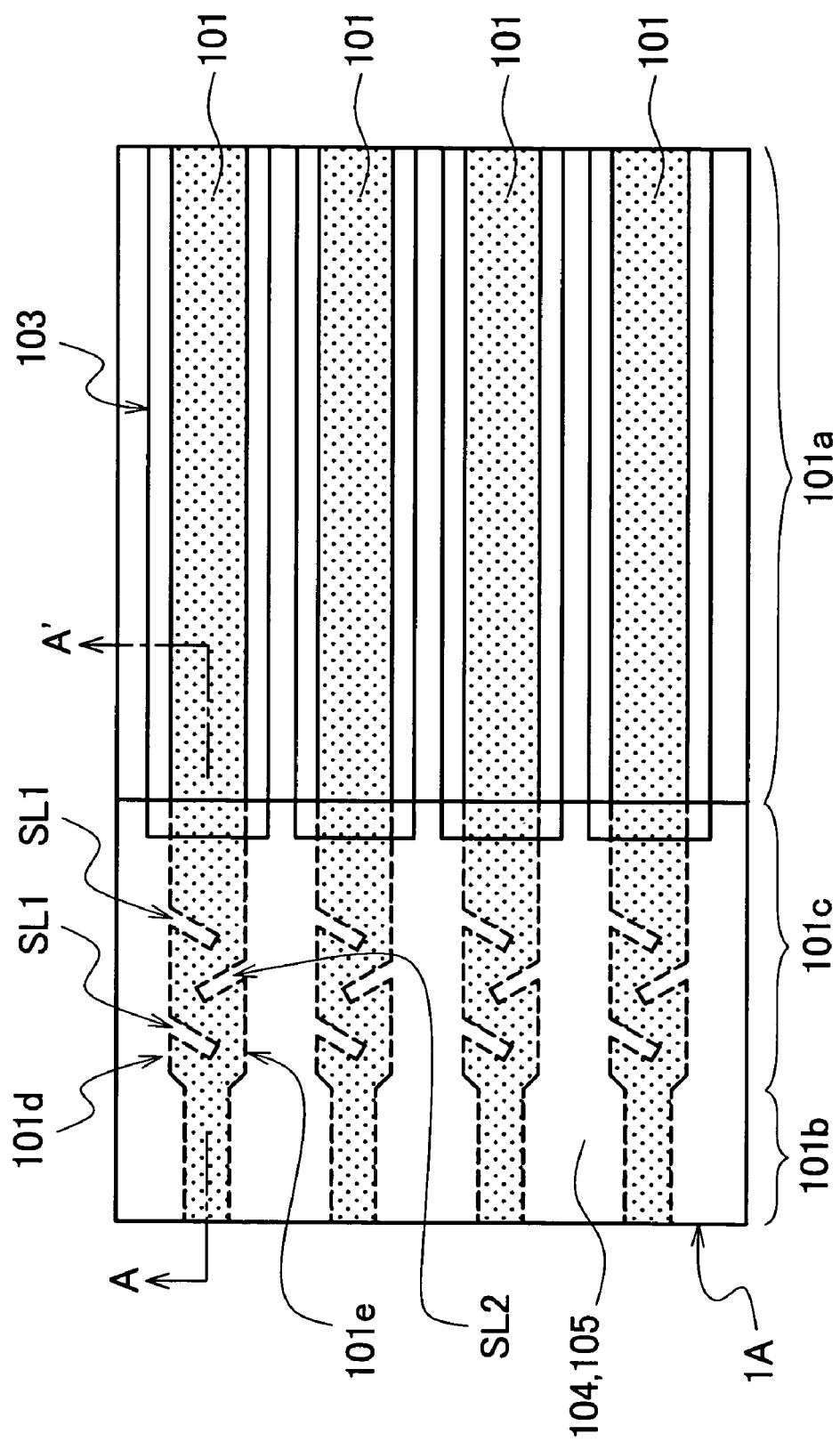
FIG. 2 is a schematic view showing a schematic structure of the display panel according to the embodiment of the invention, which is an enlarged plan view of a region "L" in FIG. 1.
Figure 3:
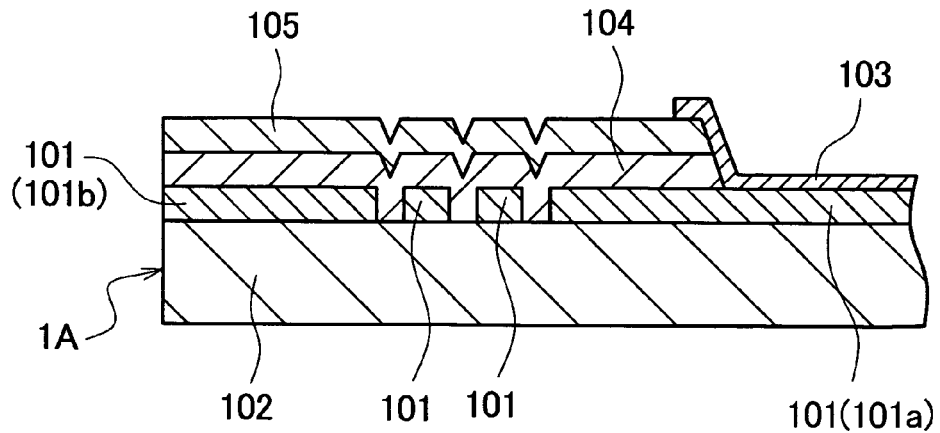
FIG. 3 is a schematic view showing a schematic structure of the display panel according to the embodiment of the invention, which is a sectional view taken along the A-A' line in FIG. 2.
Figure 4:
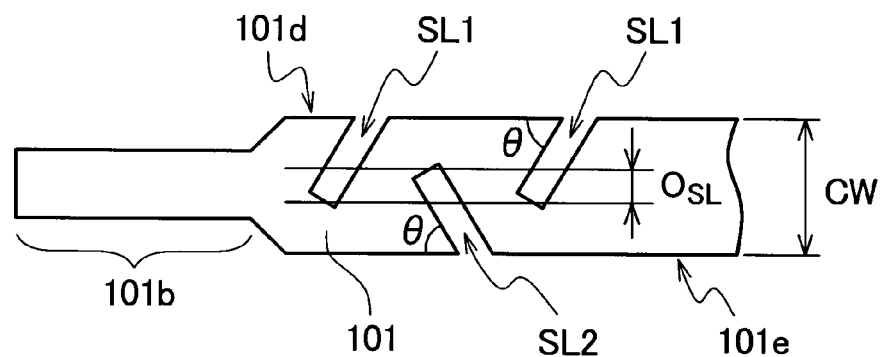
FIG. 4 is a schematic view showing a schematic structure of the display panel according to the embodiment of the invention, which explains an structural example of a wiring.

FIG. 1 to FIG. 4 are schematic views showing a schematic structure of a display panel according to an embodiment of the invention. FIG. 1 is a plan view showing the whole structure of a display panel, FIG. 2 is an enlarged plan view of a region "L" in FIG. 1, FIG. 3 is a sectional view taken along the A-A' line in FIG. 2, and FIG. 4 is a view for explaining a structural example of a wiring.

In FIG. 1, a numeral 1 denotes a first substrate (TFT substrate), a numeral 2 denotes a second substrate, a numeral 3 denotes a sealing member and a numeral 4 denotes a liquid crystal material. In FIG. 2 to FIG. 4, 1A denotes a substrate end face, 101 denotes a wiring, 101*a* denotes a connecting terminal portion of the wiring, 101*b* denotes an end portion of the wiring. 101*c* is a portion having slits, 101*d* denotes a first end face of the wiring, 101*e* denotes a second end face of the wiring, 102 is a transparent substrate, 103 denotes an ITO film, 104 denotes a SiN film, 105 denotes a passivation film, SL1 denotes a first slit, ST2 denotes a second slit.

The display panel of the embodiment is, for example, a liquid crystal display panel, which is, as shown in FIG. 1, a display device in which the first substrate 1 and the second substrate 2 are arranged to overlap each other, being bonded with the annular sealing member 3 and the liquid crystal material 4 is filled between the substrates 1 and 2. In this case, the first substrate 1 is, for example, a TFT substrate on which TFT elements are arranged in array, and the second substrate 2 is, for example, an opposite substrate on which common electrodes and a color filter are arranged. A type of display device having common electrodes on the first substrate 1 (TFT substrate) is also preferable.

An edge of the first substrate 1, that is, the enlarged region "L" of the display panel shown in FIG. 1 has a structure such as shown in FIG. 2 and FIG. 3. In this case, the wiring 101 which reaches the end face 1A is arranged on the first substrate 1. The wiring 101 is provided on the transparent substrate 102 such as a glass substrate, which concentrates and leads out a gate wiring, a source wiring and the like of the TFT elements. The wiring 101 is the wiring to be electrically connected to an outer lead of a TCP or a COF on which a driver IC is mounted. At this time, a conductive film such as the ITO film 103 is arranged at a region 101*a* (hereinafter, refer to as a connecting terminal portion) at which the wiring 101 is connected to the outer lead of the TCP or the COF. The end portions 101b and 101c of the wiring 101, in other words, portions between the connecting terminal portion 101a and the substrate end face 1A are protected by insulating films such as the SiN film 104, the passivation film 105.

In the display panel according to the embodiment, as shown in FIG. 2 and FIG. 3, the first slit SL1 extending from the first end face 101d which is along the extending direction of the wiring 101 toward a direction of the second end face 101e, and the second slit SL2 extending from the second end face 101e toward a direction of the first end face 101d are arranged alternately between the connecting terminal portion 101a and the substrate end face 1A of the wiring 101. At this time, it is preferable that respective slits SL1, SL2 extend in oblique directions with respect to the extending direction of the wiring 101 as shown in FIG. 4. In addition, both the first slit SL1 and the second slit SL2 extend in the direction of the same angle θ from respective end faces 101d, 101e of the wiring 101. Also at this time, it is preferable that the angle θ is, for example, approximately 45 degrees.

In this case, it is preferable that the first slit SL1 and the second slit SL2 are displaced with respect to each other along the extending direction of the wiring and are overlapped with respect to each other in the wiring width direction as shown in FIG. 4. At this time, an overlapping amount of the slits $O_{SL}$ can be any degree unless the wiring 101 is disconnected due to the connection between the first slit SL1 and the second slit SL2, and the amount is preferable to be, for example, 10% to 90% of the wiring width CW.

In the wiring 101, the wiring width of the end portion 101b in the vicinity of the substrate end face 1A is usually thinner than the wiring width of the connecting terminal portion 101a as shown in FIG. 2 and FIG. 4. Accordingly, it is preferable that respective slits SL1 and SL2 are provided at the portion 101c thicker in the wiring width between the end portion 101b and the connecting terminal portion 101a of the wiring 101.

The liquid crystal display panel according to the embodiment may have the same structure as the conventional liquid crystal display panel except the respective slits SL1, SL2 provided between the connecting terminal portion 101a and the end portion 101b of the wiring as shown in FIG. 2 to FIG. 4, therefore, the detailed explanation about the other structures is omitted.

Figure 5:
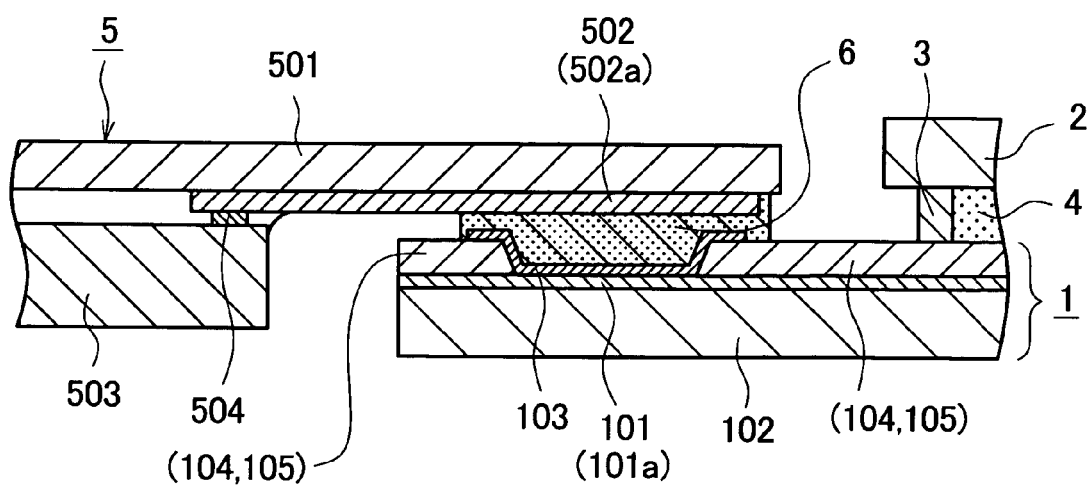
FIG. 5 is a schematic view showing a schematic structure of a display device using the display panel of the embodiment, which is an enlarged sectional view of a connection area between the display panel and a driver IC.

FIG. 5 is a schematic view showing a schematic structure of a display device using the display panel according to the embodiment, which is an enlarged sectional view of a connection area between the display panel and the driver IC.

In the display device using the liquid crystal display panel according to the embodiment, for example, the connecting terminal portion 101a of the wiring 101 concentrated and led out at the edge of the display panel is electrically connected to an outer lead 502a of the TCP 5. The TCP is a semiconductor package in which a semiconductor chip 503 such as the driver IC is mounted on a flexible substrate having a wiring 502 on a film-shaped insulating substrate 501 as shown in FIG. 5. At this time, an external electrode (not shown) of the semiconductor chip 503 and the wiring 502 of the flexible substrate are electrically connected by, for example, a gold bump 504 and the like. Also at this time, the connecting terminal portion 101a of the wiring 101 is electrically connected to the outer lead 502a of the TCP using, for example, an ACF 6.

When the connecting terminal portion 101a of the wiring and the outer lead 502a of the TCP are connected using the ACF 6, the ACF 6 is cured by thermo compression bonding after positioning. At this time, the faulty connection caused by displacement may occur. In the case the faulty connection occurs, the TCP 5 is removed once and the ACF 6 adhered to surfaces of the connecting terminal portion 101a of the wiring and the outer lead 502a of the TCP is removed, then, connecting work is performed again.

However, for example, when the work of removing the ACF 6 adhered to the connecting terminal portion 101a of the wiring, the end portion 101b of the wiring 101 may be peeled from the transparent substrate 102 at side surface of the display panel. Generally, since the adhesion strength between the wiring 101 and the transparent substrate (glass substrate) 102 is low, if peeling occurs at the end portion 101b of the wiring, the peeling proceeds to the inside. In the case that the peeling of the wiring 101 proceeds to the connecting terminal portion 101a, the faulty connection such as disconnection occurs when the outer lead 502a of the TCP is connected again.

Consequently, as in the display panel of the embodiment, by providing the slits SL1, SL2 between the connecting terminal portion 101a of the wiring 101 and the substrate end face 1A, for example, when peeling occurring at the end portion 101b of the wiring proceeds to the portion 101c in which respective slits SL1, SL2 are provided, it is folded or cut off at the slit portion 101c, therefore, the peeling can be prevented from proceeding further from the slit portion 101c. Accordingly, peeling of the connecting terminal portion 101a of the wiring and the faulty connection caused by disconnection at the time of connecting the outer lead 502a of the TCP again can be prevented.

When the first substrate 1 is manufactured, a transparent substrate which is larger than an outside dimension generally required for the liquid display panel is used, and the wirings 101 and the TFT elements are formed. After the wirings 101 and the TFT elements are formed, the first substrate 1 is cut out so as to fit to the outside dimension required for the liquid crystal display panel. At this time, in order to prevent electrostatic discharge damage which damages the TFT elements by being charged during the manufacturing process of the first substrate, the wirings 101 usually concentrated and led out at edges of the first substrate 1 are short-circuited and grounded outside regions where the substrate is cut out. Therefore, when cutting out the first substrate 1, the wirings 101 are also cut off. As a result, the wirings 101 reach the substrate end face 1A in an exposed state as shown in FIG. 2 and FIG. 3.

As described above, the wiring 101 is also cut off when cutting out the first substrate 1, by the shock of the cutting, the end portions 101b is sometimes peeled from the transparent substrate 102. At this time, if the peeling of the wiring 101 proceeds to the connecting terminal portion 101a, even when the connecting terminal portion 101a of the wiring is connected to the outer lead 502a of the TCP for the first time, the faulty connection caused by peeling or disconnection of the connecting terminal portion 101a of the wiring may occur. Consequently, in the case that slits are provided between the connecting terminal portion 101a of the wiring 101 and the substrate end face 1A as in the display panel of the embodiment, the peeling can be prevented from proceeding further from the slit part 101c, even when the peeling occurs at the terminal portion 101b of the wiring due to the shock of cutting out the first substrate 1. Therefore, when connecting the outer lead 502a of the TCP first, the faulty connection can be prevented, which is caused by peeling or disconnection of the connecting terminal portion 101a of the wiring.

In the display device using the liquid crystal display panel of the embodiment, the end portion 101b of the wiring is exposed at the end face 1A of the substrate 1 as shown in FIG. 3. Therefore, there is a case that the wiring 101 corrodes by being exposed to the air, and corrosion may proceed to the inside. At this time, when the conventional wiring not having the above-mentioned slits is used, the corrosion proceeds to the connecting terminal portion 101*a* of the wiring and conduction failure may occur. However, when the respective slits SL1, SL2 are provided as in the embodiment, the corrosion can be prevented from proceeding at the portion 101*c* where the respective slits SL1, SL2 are provided. Consequently, the conduction failure by corrosion of the connecting terminal portion 101*a* of the wiring hardly occurs.

As described above, according to the display panel of the embodiment, the proceeding of peeling from the end portion 101*b* of the wiring can be held back at the portion 101*c* where the slits SL1, SL2 are provided, thereby preventing peeling or disconnection of the connecting terminal portion 101*a* of the wiring. Consequently, the faulty connection caused by peeling or disconnection when the connecting terminal portion 101*a* of the wiring is connected to the outer lead 502*a* of the TCP or the COF can be reduced.

In addition, it is possible to hold back the proceeding of corrosion from the end portion 101*b* of the wiring at the portion 101*c* where the slits SL1, SL2 are provided and reduce the conduction failure by the corrosion of the connecting terminal portion 101*a* of the wiring. In preventing the proceeding of corrosion, a structure in which end portions of wirings or the conductive layer are inside of the substrate end face is also effective.

For example, even if the end portion 101*b* of the wiring is peeled from the transparent substrate 102 by the shock of cutting out the first substrate 1, the proceeding of peeling can be held back at the portion 101*c* where the respective slits LS1, LS2 are provided. Consequently, when the first substrate 1 is manufactured, even if the wirings 101 are short-circuited and grounded outside regions where the substrate is cut out in order to prevent electrostatic discharge damage of the TFT elements, peeling or disconnection of the connecting terminal portion 101*a* of the wiring can be prevented.

Figure 6:
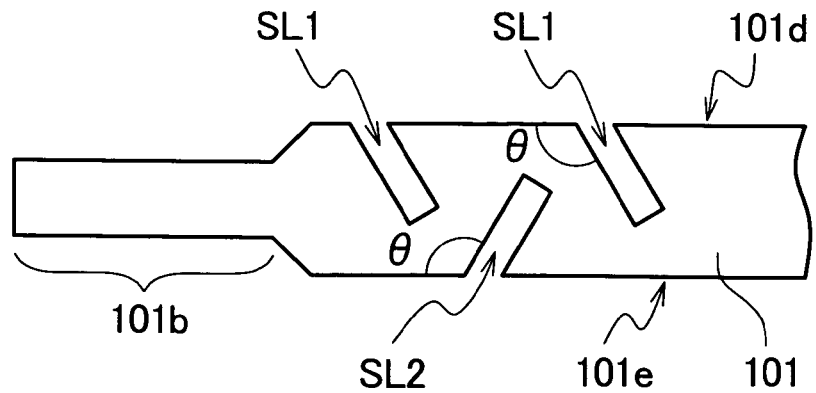
FIG. 6 is a schematic view for explaining a modification example of the embodiment, which is the view for explaining the modification example of directions of slits.
Figure 7:
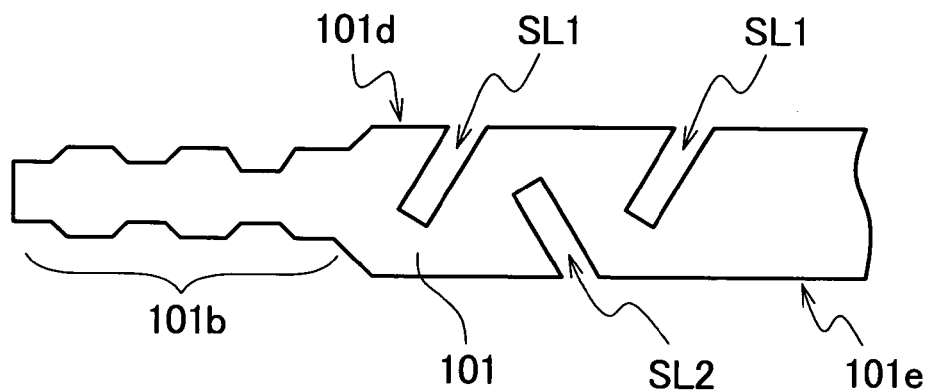
FIG. 7 is a schematic view for explaining a modification example of the embodiment, which is a view for explaining the modification example of a shape of a wiring end portion.
Figure 8:
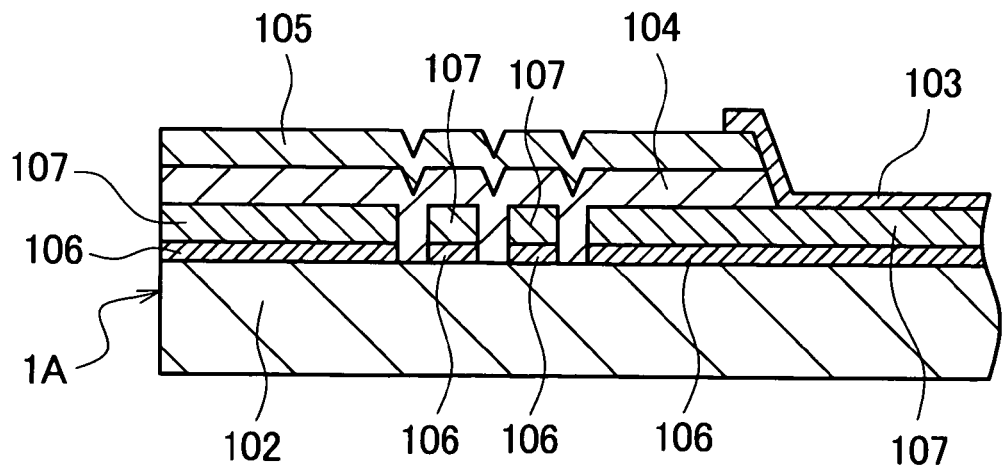
FIG. 8 is a schematic view for explaining a modification example of the embodiment, which is a view for explaining the modification example in the case of the wiring in which two kinds of conductors are stacked.
Figure 9:
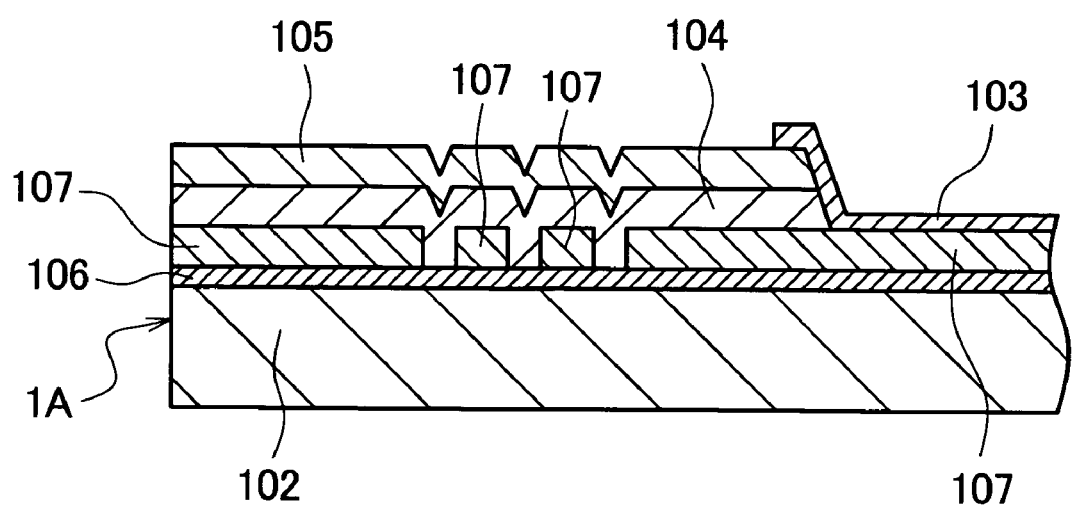
FIG. 9 is a schematic view for explaining a modification example of the embodiment, which is a view for explaining the modification example in the case of the wiring in which two kinds of conductors are stacked.

FIG. 6 to FIG. 9 are schematic views for explaining modification examples of the embodiment. FIG. 6 is a view for explaining the modification example concerning the direction of slits, FIG. 7 is a view for explaining the modification example concerning a shape of wiring end portion, and FIG. 8, FIG. 9 are views for explaining modification examples in the case of the wiring in which two kinds of conductors are stacked.

In the above embodiment, the slits SL1, SL2 extend at a slant toward the direction of the substrate end face 1A from the end faces 101*d*, 101*e* of the wiring as shown in FIG. 2 and FIG. 4, however, they are not limited to this, and it is also preferable that the slits extend at a slant toward the direction of the connecting terminal portion 101*a* of the wiring from the end faces 101*d*, 101*e* of the wiring as shown in FIG. 6. The function of the slits is, for example, to prevent peeling occurring at the end portion 101*b* of the wiring from proceeding, and the slit portion is required to be flexible or to be cut off easily, as compared with a portion where the respective slits SL1, SL2 are not provided. Consequently, as to directions of the slits SL1, SL2, it is preferable that an angle between the slits and respective end faces 101*d*, 101*e* of the wiring is within 30 degrees to 50 degrees.

In the embodiment, as shown in FIG. 2 and FIG. 4, the end portion 101*b* of the wiring has the fixed wiring width, however, it is not limited to this, and it is also preferable, for example, to form constricted portions, that is, portions having the wide wiring width and portions having narrow wiring width, as shown in FIG. 7. According to this, the proceeding of peeling or corrosion of the wiring 101 can be prevented in some degree even before reaching the portion 101*c* where the respective slits SL1, SL2 are provided, therefore, the structure heightens the effect of preventing the proceeding of peeling or corrosion at the portion where the respective slits SL1, SL2 are provided.

In the embodiment, the wiring 101 is a wiring which is formed by a single conductor as shown in FIG. 3, however, it is not limited to this, and it is also preferable that, for example, a wiring is formed by stacking two kinds of conductors, namely, a first conductor 106 and a second conductor 107 as shown in FIG. 8. In this case, as a combination of the first conductor 106 and the second conductor 107, for example, a combination of an ITO as the first conductor 106 and a metal as the second conductor is preferable. Also in such structure, the adhesion strength is low, for example, at an interface between the ITO 106 and the metal 107, and an interface between the transparent substrate (glass substrate) 102 and the ITO 106, therefore, peeling tends to occur. Accordingly, as shown in FIG. 8, proceeding of peeling or corrosion of the wiring can be prevented by disposing the slits SL1, SL2 in the ITO 106 and the metal 107. Additionally, the same idea can be applied in the case of a conductor having three layers and more.

In the case of the wiring in which two kinds of conductors are stacked, it is preferable to provide slits, for example, only in the second conductor 107 as shown in FIG. 9. The same idea can be applied when the conductor has three layers and more.

While the invention has been specifically described based on the embodiment, it is obvious that the invention is not limited to the embodiment and may be modified variously within the scope of the gist thereof.

For example, the display panel is not limited to the liquid crystal panel, and may be a plasma panel, organic EL panel and the like.

What is claimed is:

1. A display panel comprising a conductive layer including a plurality of wirings laminated onto a substrate, in which the respective wiring is connected to a terminal portion and extends therefrom so as to be electrically connected to an outside circuit at an edge of the display panel, comprising:

a plurality of slits which are disposed in the wiring between the terminal portion and the edge of the display panel to prevent delamination of the wirings from the substrate in an area adjacent to the terminal portion, wherein the wirings each have a lower surface contacting the substrate and an upper surface opposite to said lower surface, wherein the slits each extend from said upper surface to said lower surface, and wherein the slits include at least a first slit and a second slit, the first slit and the second slit differing from one another in an extending direction.

2. The display panel according to claim 1, wherein the first slit extends in the wiring in a direction from a first side edge toward a second side edge of the wiring and the second slit extends in a direction from the second side edge toward the first side edge, the first and second slits being displaced with respect to each other in the extending direction of the wiring, and overlapped with each other in the width direction of the wiring.

3. The display panel according to claim 2, wherein the first and second slits extend in oblique directions with respect to the extending direction of the wiring.

4. The display panel according to claim 2,
wherein an angle between the extending direction of the wiring and the extending direction of the first and second slits is 30 degrees to 150 degrees.

5. The display panel according to claim 2,
wherein the wiring is formed by stacking two kinds of conductors and the first and second slits are provided both in the two kinds of conductors.

6. The display panel according to claim 2,
wherein the wiring is formed by stacking two kinds of conductors and the first and second slits are provided in either one of the two kinds of conductors.

7. The display panel according to claim 1,
wherein the wiring extends from the terminal to an end edge of a substrate of the display panel.

8. A display device comprising:
a display panel comprising a conductive layer including a plurality of wirings laminated onto a substrate, in which at least on wiring is connected to a terminal portion and extends therefrom so as to be electrically connected to an outside circuit at an edge of the display panel, and
a plurality of slits disposed in the wiring between the terminal portion and the edge of the display panel to prevent delamination of the wirings from the substrate in an area adjacent to the terminal portion,
wherein the wirings each have a lower surface contacting the substrate and an upper surface opposite to said lower surface,
wherein the slits each extend from said upper surface to said lower surface, and
wherein the slits include at least a first slit and a second slit, the first slit and the second slit differing from one another in an extending direction.

9. The display device according to claim 8,
wherein the first slit extends in the wiring in a direction from a first side edge toward a second side edge of the wiring and the second slit extends in a direction from the second side edge toward the first side edge, the first and second slits being displaced with respect to each other in the extending direction of the wiring, and overlapped with each other in the width direction of the wiring.

10. The display device according to claim 9,
wherein the first and second slits extend in oblique directions with respect to the extending direction of the wiring.

11. The display device according to claim 9,
wherein an angle between the extending direction of the wiring and the extending direction of the first and second slits is 30 degrees to 150 degrees.

12. The display device according to claim 8,
wherein the wiring is formed by stacking two kinds of conductors and the first and second slits are provided in the two kinds of conductors.

13. The display device according to claim 8,
wherein the wiring is formed by stacking two kinds of conductors and the first and second slits are provided in either one of the two kinds of conductors.

14. The display device according to claim 8,
wherein the wiring extends from the terminal portion to an end edge of a substrate of the display panel.

15. A display panel comprising:
a first substrate and a second substrate, the first substrate including a first region which does not overlap with the second substrate and a second region which overlaps with the second substrate;
a plurality of terminals to which a signal is input from an outside circuit, the terminals being formed on the first region of the first substrate;
a plurality of conductive layers which are signal lines being formed on the first substrate so as to extend from an end edge of the first substrate in the first region toward the second region;
each conductive layer being formed at a lower layer of one of the terminals, and each conductive layer being electrically connected to an associated one of the terminals;
wherein each conductive layer is provided with a plurality of slits in the conductive layer between the terminals and the edge of the first substrate to prevent delamination of the wirings from the substrate in an area adjacent to the terminal portion,
wherein the conductive layers each have a lower surface contacting the substrate and an upper surface opposite to said lower surface, and
wherein the slits include at least a first slit and a second slit, the first slit and the second slit differing from one another in an extending direction.

16. The display panel according to claim 15, wherein the slits extend in oblique directions with respect to the extending direction of the conductive layer.

17. The display panel according to claim 16, wherein an angle between the extending direction of the conductive layer and the extending direction of the slits is in a range of 30° to 150°.

18. The display panel according to claim 15, wherein the conductive layer is formed by stacking two kinds of conductors and the slits are formed in one of at least one of the two kinds of conductors.

19. The display panel according to claim 15, wherein the display panel forms part of a display device.

20. The display panel according to claim 15, wherein the slits extend from opposing side edges of the conductive layer from one side edge toward opposite side edge.

21. The display panel according to claim 1,
wherein the slits are arranged in locations to stop delamination of the wirings from the substrate.

22. The display panel according to claim 8,
wherein the slits are arranged in locations to stop delamination of the wirings from the substrate.

23. A display panel comprising:
a conductive layer including a plurality of wirings laminated onto a substrate, in which at least one wiring is connected to a terminal portion and extends therefrom so as to be electrically connected to an outside circuit at an edge of the display panel, and
means for preventing delamination of the wiring from the substrate, the means comprising a plurality of slits which were disposed in the wiring between the terminal portion and the edge of the display panel to prevent delamination of the wirings from the substrate in an area adjacent to the terminal portion,
wherein the wirings each have a lower surface contacting the substrate and an upper surface opposite to said lower surface,
wherein the slits each extend from said upper surface to said lower surface, and
wherein the slits include at least a first slit and a second slit, the first slit and the second slit differing from one another in an extending direction.

24. The display panel according to claim 23,
wherein the slits are arranged in locations to stop delamination of the wirings from the substrate.

25. The display device according to claim 1,
A insulation layer formed on a layer of the wiring, the slits are formed between the insulation layer and the display panel.

26. The display device according to claim 8,
A insulation layer formed on a layer of the wiring, the slits are formed between the insulation layer and the display panel.

27. The display device according to claim 15,
A insulation layer formed on a layer of the wiring, the slits are formed between the insulation layer and the display panel.

28. The display device according to claim 23,
A insulation layer formed on a layer of the wiring, the slits are formed between the insulation layer and the display panel.

* * * * *